United States Patent
Castaldo et al.

(10) Patent No.: US 7,602,230 B2
(45) Date of Patent: Oct. 13, 2009

(54) CONTROL INTEGRATED CIRCUIT FOR A CHARGE PUMP

(75) Inventors: Enrico Castaldo, Catania (IT); Antonino Conte, Tremestieri Etneo (IT); Gianbattista Lo Giudice, Pedara (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 11/771,157

(22) Filed: Jun. 29, 2007

(65) Prior Publication Data

US 2008/0007321 A1  Jan. 10, 2008

(30) Foreign Application Priority Data

Jul. 6, 2006  (EP)  .................................. 06425465

(51) Int. Cl.
  *H03K 3/01*  (2006.01)
(52) U.S. Cl. ........................ 327/534; 327/535; 327/538; 327/539; 327/540
(58) Field of Classification Search .......... 327/538–540
  See application file for complete search history.

(56) References Cited

U.S. PATENT DOCUMENTS

| | | | |
|---|---|---|---|
| 5,359,552 A * | 10/1994 | Dhong et al. | 365/189.09 |
| 6,320,796 B1 | 11/2001 | Voo et al. | |
| 6,480,427 B2 * | 11/2002 | Kuriyama | 365/189.11 |
| 2003/0006742 A1 | 1/2003 | Jahanshir et al. | |
| 2003/0218453 A1 * | 11/2003 | Castaldo et al. | 323/283 |
| 2006/0133149 A1 * | 6/2006 | Chae et al. | 365/185.18 |

OTHER PUBLICATIONS

European Search Report EP 06 42 5465; Feb. 2, 2007.

* cited by examiner

*Primary Examiner*—Lincoln Donovan
*Assistant Examiner*—John W Poos
(74) *Attorney, Agent, or Firm*—Hogan & Hartson LLP

(57) ABSTRACT

An integrated control circuit for a charge pump includes a first device for regulating the output voltage of the charge pump and a second device for increasing the output voltage from the charge pump with a set ramp. The integrated circuit includes means for activating said first device and providing it with a first value of a supply signal in a first period of time and for activating the second device and providing it with a second value of the supply signal that is greater than the first value in a second period of time after the first in such a way that the output voltage of the charge pump ascends a ramp from a first value to a second value that is greater than the first value, the second value being fixed by reactivation of the first device.

22 Claims, 4 Drawing Sheets

CONTROL INTEGRATED CIRCUIT FOR A CHARGE PUMP

RELATED APPLICATION

The present application claims priority of European Patent Application No. 06425465.9 filed Jul. 6, 2006, which is incorporated herein in its entirety by this reference.

FIELD OF THE INVENTION

The present invention relates to an integrated control circuit for a charge pump.

BACKGROUND OF THE INVENTION

In EEPROM memories it is necessary that the high voltage levels in the order of 12 or 15 V generated by the charge pump for programming and deletion operations are maintained at a virtually constant value whatever current delivery is required (the so-called driving capability), which is normally in the order of dozens of microamperes. This enables a stable and known output voltage to be available that does not exceed the limits set by the dielectric strength of the oxides, of the transistors and of the capacitors, with the risk of damaging them permanently by producing perforations.

A typical initial wiring diagram is shown in FIG. 1, in which a charge pump 1 generates an output voltage Vout sent to a comparator 2, which compares the voltage Vout with a voltage Vreg. Vreg is the desired regulating voltage generated from a known and extremely stable reference voltage, for example a BandGap circuit. If Vout>Vreg, the comparator 2 sends a logic signal Von to a control circuit 3, having a clock input pulse CLOCK, that blocks transmission of the CLOCK pulses to a phase generator 4 suitable for supplying the charge pump 1. Thus the charge pump 1 starts to discharge until the voltage Vout becomes less than the voltage Vreg. By means of said feedback a dynamic equilibrium is reached that determines the steady state Vout=Vreg. Once the regulating condition has been reached, the charge pump 1, if it is a vacuum pump, is switched off in order to not dissipate power unnecessarily. In the presence of a charge that requires current, the circuit lets the clock pulses pass so as to compensate for the decrease in output voltage Vout due to the delivered charge.

In order to obtain the signal Von, a circuit is used as shown in FIG. 2. The circuit comprises a resistive divider formed by the series of two resistances Rup and Rdown arranged between Vout and ground GND. The voltage Vr at the heads of the resistance Rdown is sampled and compared with a reference voltage Vbg supplied by a bandgap circuit by means of a comparator 5. The signal at the comparator output is the signal Von that allows or does not allow the passage of the clock pulses CLOCK from the circuit 3 to the phase generator 4. As shown in FIG. 2, two capacitors Cup and Cdown are arranged at the heads of the respective resistances Rup and Rdown and necessary for compensating parasitic capacity.

The regulating voltage obtained as an average value arises from Vout=Vbg*(1+Rup/Rdown). The circuit disclosed in FIGS. 1 and 2 is used both for the charge pump used in the reading operations of the EEPROM memories and for the charge pump used in the writing operations thereof.

The output voltage of the charge pump is carried on the memory cells in ramp mode so as not to risk breakage of the oxide layers of the memory cells. Normally the ramp generator charges a capacitor with a direct current to obtain a linear increase. In FIG. 3 there is shown a typical diagram of the regulation of the charge pump with a ramp generating circuit used for the EEPROM cells. The ramp generating circuit comprises an operational amplifier 6 having the input voltage Vbg on the inverting terminal and the voltage Vbot on the non-inverting terminal. The output of the operational amplifier 6 controls a transistor PMOS M1 having the source terminal connected to the output voltage Vout from the charge pump 3 of the circuit in FIG. 1. The drain terminal LS of the transistor M1 is connected to a capacitor C1 having the other terminal connected to the voltage Vbot at the heads of a current generator Ic connected to ground GND. The node LS is charged at a constant tilt equal to Ic/C1. By modulating the current, the ascent speed of the voltage is varied appropriately.

The node LS controls a first plurality of transistors identical to the plurality of transistors suitable for selecting the memory cells. Each selection transistor has the voltage LS on the gate terminal while the voltage on the source terminal of each transistor of the first plurality is the same as the ramp voltage Vramp decreased of the threshold voltage of the transistor. In this way, coupling of the voltage Vramp and the voltage actually present on the memory cells is assured. In the diagram of FIG. 3 it is shown that the regulating node controlled directly is the node VP0 and the output voltage Vout of the charge pump is controlled indirectly through the transistors 125 that, through the coupling with those of the latch part of the memory cells and with the selection transistors of the memory cells, replicate exactly the programming and deletion path. As said transistors that are a copy of the latch part and of the selection transistors are in the ramp generator, by regulating the node VP0 also the voltage Vramp is regulated, as VP0 is the maximum value of Vramp except for decoupling between the paths of the voltages in play.

Nevertheless, for example, during the memory cell programming phase, a voltage drop may be generated on the selection transistors that distances the voltage level Vramp from the expected value. Furthermore, the copy of the latch and selection transistors waste space.

Thus there remains a need for an integrated control circuit for a charge pump that overcomes the aforementioned drawbacks.

SUMMARY OF THE INVENTION

According to the present invention, an integrated control circuit for a charge pump includes a first device for regulating the output voltage of the charge pump. The control circuit includes a second device for increasing the output voltage from the charge pump with a set ramp and means for activating the first device and providing it with a first value of a supply signal in a first period of time and for activating the second device and for providing it with a second value of the supply signal that is greater than the first value in a second period of time after the first in such a way that the output voltage of the charge pump ascends a ramp from a first value to a second value greater than the first value, the second value being fixed by reactivation of the first device.

BRIEF DESCRIPTION OF THE DRAWINGS

The features and advantages of the present invention will be clear from the following detailed description of a practical embodiment illustrated by way of non-limitative example in the attached drawings, in which.

DETAIL DESCRIPTION

Figure 1:
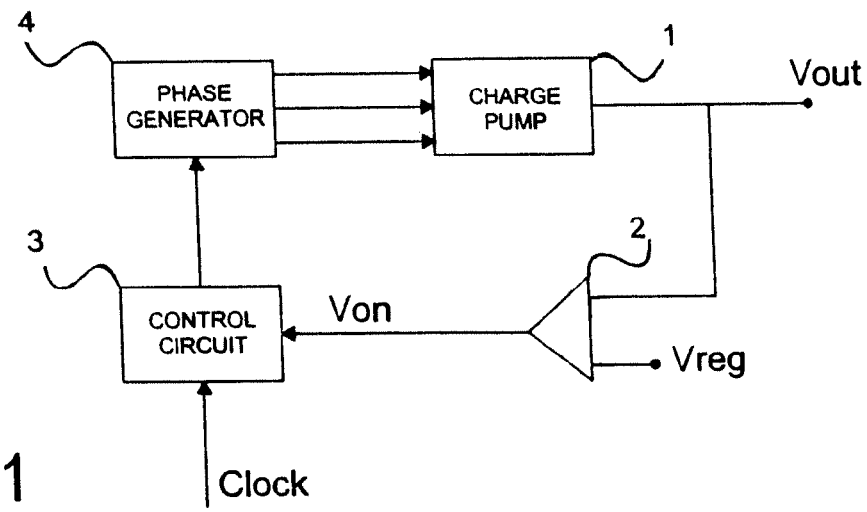
FIG. 1 is a diagram of a regulating system according to the prior art.
Figure 2:
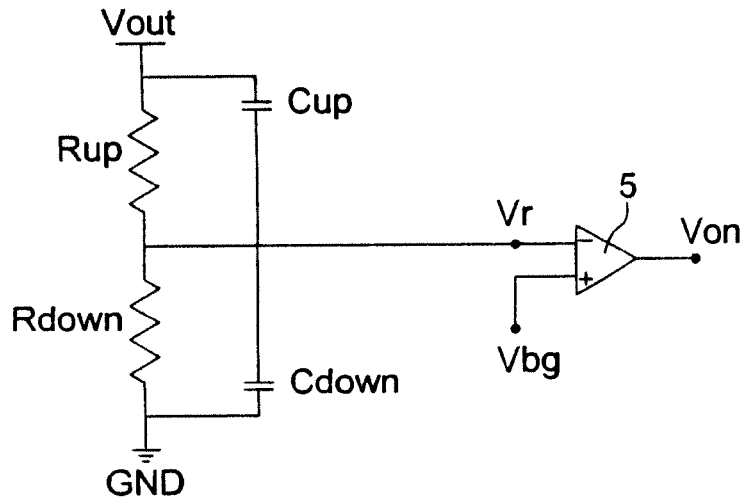
FIG. 2 shows a circuit for obtaining a signal present in the circuit in FIG. 1.
Figure 3:
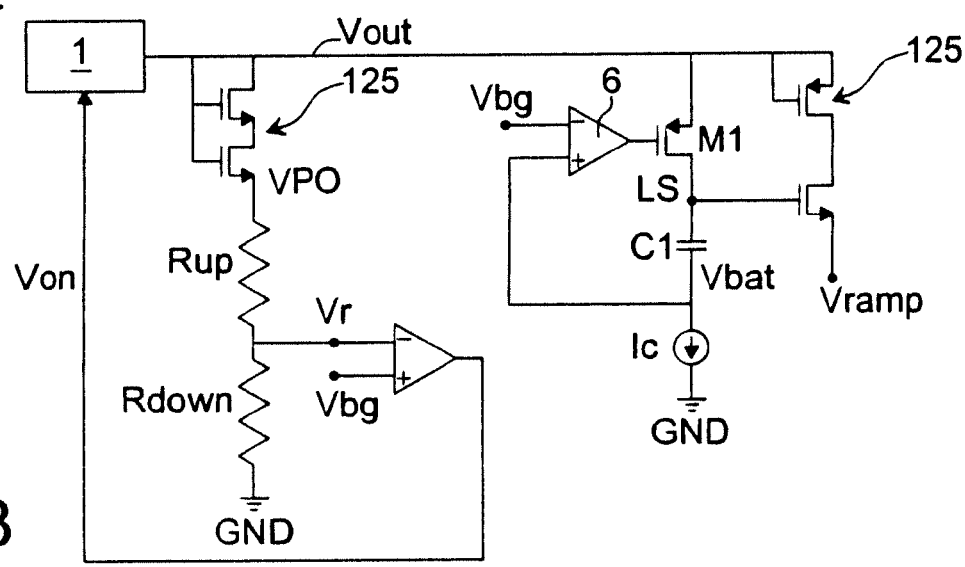
FIG. 3 shows a typical initial diagram of the ramp generating circuit used for the EEPROM cells.
Figure 4:
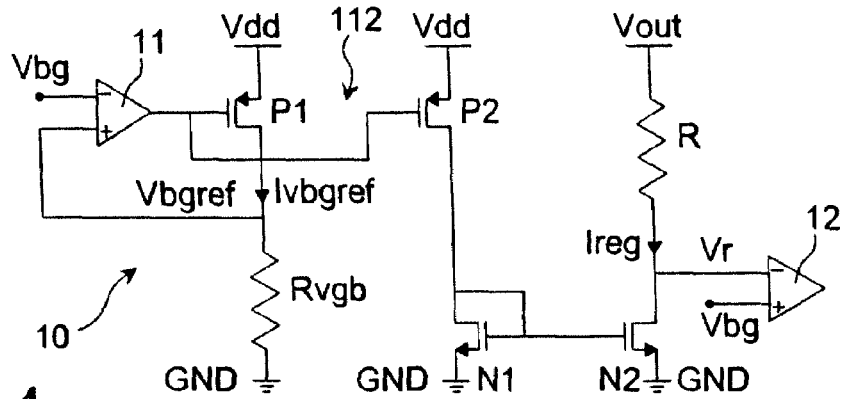
FIG. 4 shows a part of the integrated control circuit of a charge pump according to an embodiment of the present invention.

With reference to FIG. 4 there is shown a part of the integrated control circuit for a charge pump according to the present invention. The circuit in FIG. 4 is suitable for regulating the output voltage Vout from a charge pump. The circuit in FIG. 4 comprises a first circuit block 10 comprising an operational amplifier 11 at the inverting terminal of which there is present the voltage Vbg and at the non-inverting terminal of which there is present the voltage Vbgref at the heads of a resistance Rvbg arranged between the ground GND and the drain terminal of a PMOS transistor P1 having the source terminal connected to a reference voltage Vdd and the gate terminal connected to the output voltage Vpref from the operational amplifier 11; in this way there is obtained a current Ivbgref=Vbg/Rvbg that by means of another PMOS transistor P2, which is mirror-connected to the transistor P1, is taken to another transistor N1 forming part of a mirror N1, N2. The dimension of the NMOS transistor N2 is N times greater than the dimension of the transistor N1 so as to produce a current Ireg at a value selected on the basis of the value of the voltage Vout. The circuit branch comprising the transistor N2 also comprises a resistance R connected to the source terminal of the transistor N2 and to the voltage Vout. An operational amplifier 12 makes the voltage VR=Vbg; as Vout=Vbg+R*Ireg and Ireg=N*Ivbg=N*Vbg/Rvbg, there is obtained Vout=Vbg*(I+RN/Rvbg), i.e. the output voltage of the charge pump Vout depends exclusively on the bandgap voltage Vbg, which is a voltage that is stable with respect to temperature and voltage variations; each variation of a physical or technological nature to the value of the resistances is insignificant as the resistances appear in the form of a ratio. The transistors P1 and P2 are part of a block 112.

Figure 5:
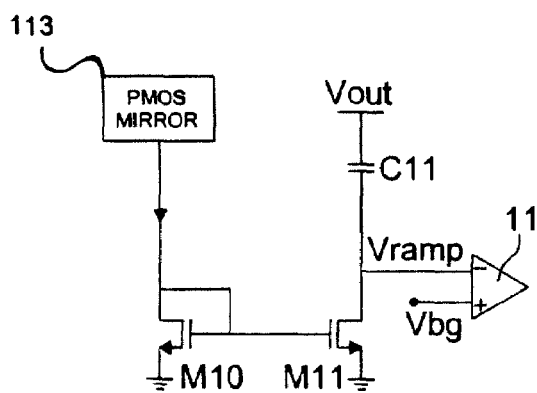
FIG. 5 shows another part of the integrated control circuit of a charge pump according to an embodiment of the present invention.

In order to obtain a voltage ramp it is necessary to use another circuit, as shown in FIG. 5. Another transistor block 113, comprising a PMOS mirror, enables a current Iramp to be taken to a current mirror M10-M11 that enables the current Iramp to be mirrored on a circuit branch comprising a capacitor C11 connected to the voltage Vout and to the drain terminal of the transistor M11. The voltage Vramp on the drain terminal of the transistor M11 is an input to the non-inverting terminal of an operational amplifier 11 having the voltage Vbg on the inverting terminal. The capacitor C11 is charged with a direct current Iramp provided by the mirror M10-M11. The voltage increases on a ramp given by Iramp/C.

Figure 6:
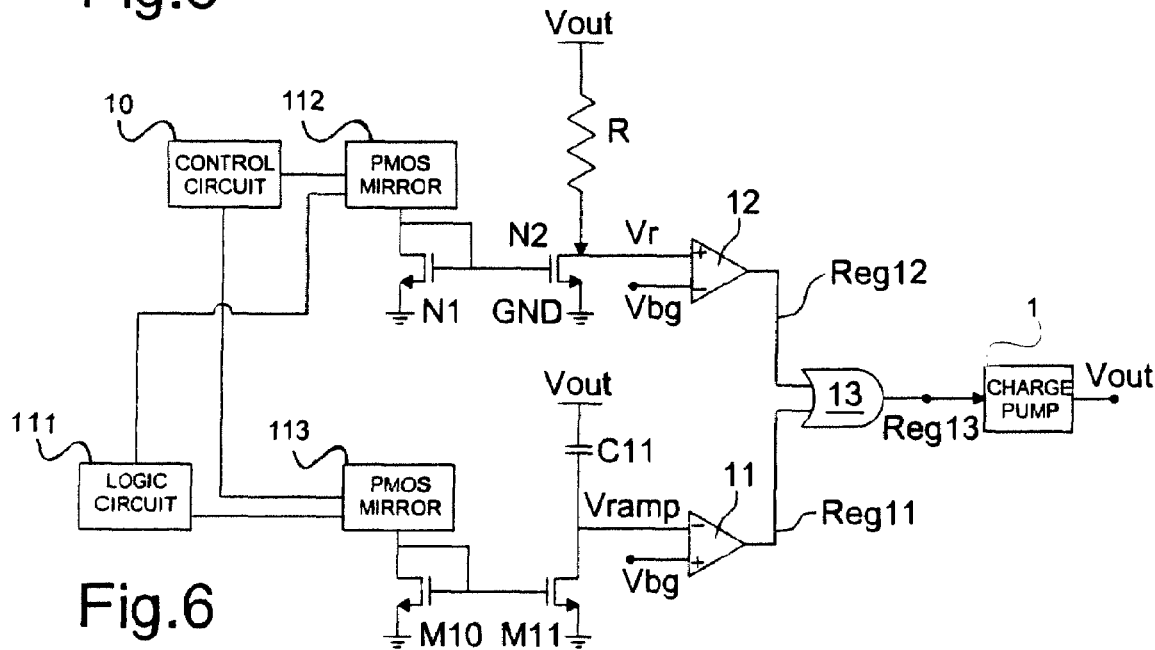
FIG. 6 shows the integrated control circuit of a charge pump according to an embodiment of the present invention.
Figure 9:
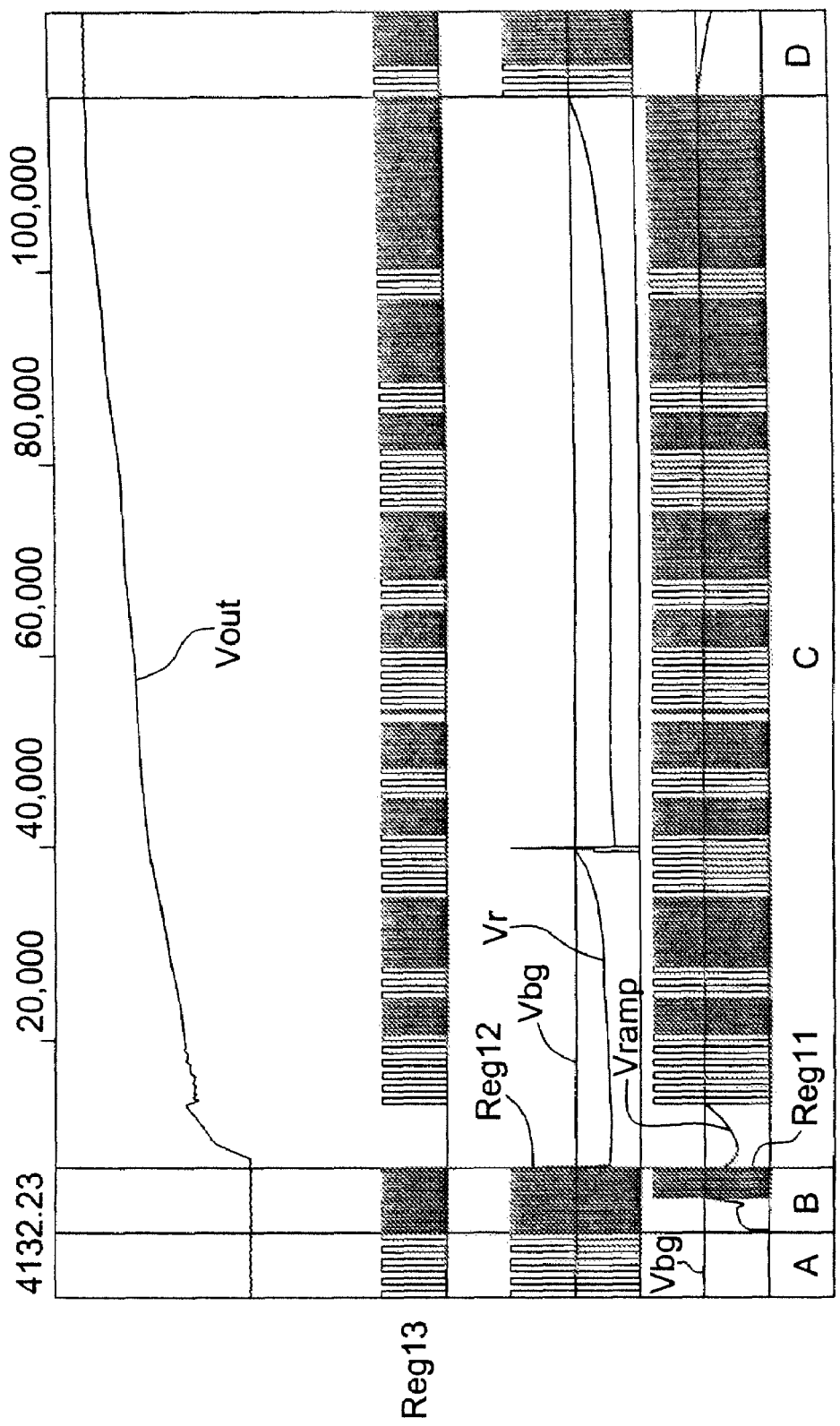
FIG. 9 shows an operating simulation of the control circuit in FIG. 6.

In FIG. 6 there is shown the circuit according to the invention that comprises the circuits of FIGS. 4 and 5 where the outputs Reg12 and Reg11 of the respective amplifiers 11 and 12 are inputs to an OR gate 13 having the output signal Reg13; said signal is an inlet signal to the charge pump 1 that provides the output voltage Vout. The circuit according to the invention preferably comprises a logic circuitry 111 that acts on blocks 112 and 113 formed respectively by PMOS transistors, that are suitable for carrying the current to the mirrors M10-M11 and N1-N2, to activate them and change the current to be taken to the ramp generator in FIG. 5 and to the regulator in FIG. 4. The operation of the circuit is as follows and is visible in FIG. 9.

In the initial phase A when the charge pump is at the lower regulating level Vlow polarized by means of an appropriate of value Ireg set by the circuitry 111, the current Iramp is nil; in this condition VR=Vbg, Reg13=Reg12, Vramp=0 and Reg11=0.

Subsequently, in phase B, the circuitry 111 activates the ramp generator by means of a precharge phase in which the node Vramp is taken to the value Vbg.

Subsequently, in the phase C, the circuitry 111 takes the current Ireg to a value that is compatible with the upper regulating value Vhigh, and in this case the capacitor branch is active and after a transition Vramp=Vbg is obtained whilst Vr<<Vbg as the regulating voltage is below the final value. In this phase, Reg11=Reg13 and Reg12=0.

Subsequently, in the phase D, when the voltage Vr becomes the same as the voltage Vbg, the voltage Vramp is discharged to ground and Reg12=Reg13 is obtained. The capacitive branch switches off and only the non-capacitive branch controls the charge pump.

The charge pump used in the case of EEPROM memories is of the reconfigurable type, i.e. it is made to operate with identical modules arranged parallel with low voltage levels, for example for reading the memory cells, or arranged in series when on the other hand a high voltage level is required, i.e. in the case of programming or deletion. In order for the reconfiguration after the formation of a voltage ramp and the subsequent discharge to be effective, i.e. so that the pump starts operating again with the modules arranged parallel rapidly without load dispersal, it is necessary for the pump to remain active during the discharge.

This involves having to dimension with attention the discharge current, which has to be greater than driving capability, but not excessively so as not to have a discharge that is so fast as not to allow redistribution of the charges.

Figure 7:
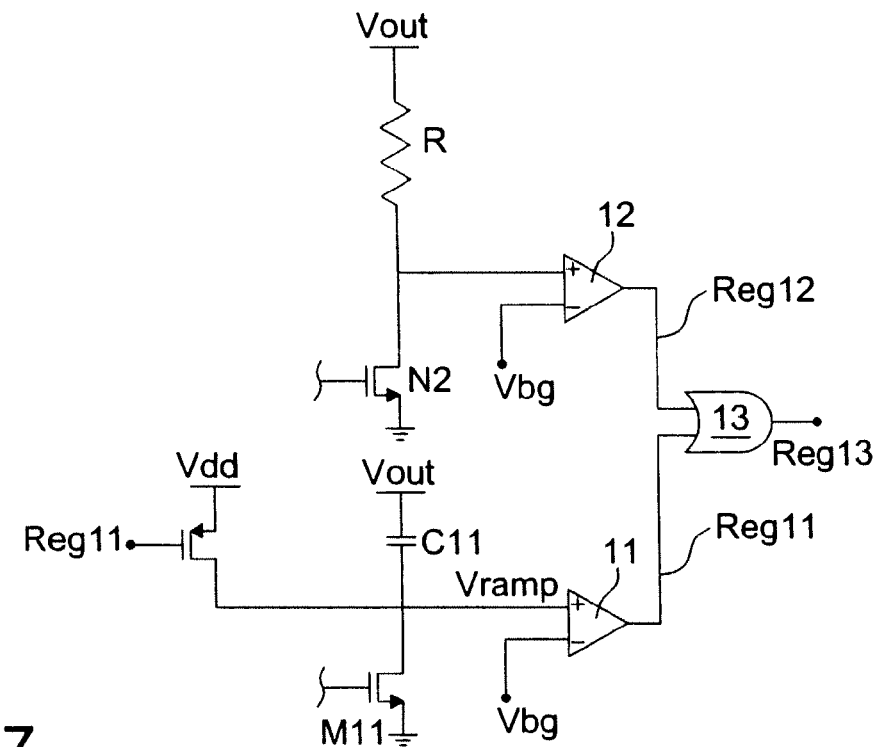
FIG. 7 shows an integrated control circuit of a charge pump according to a variation of the embodiment of the present invention.
Figure 8:
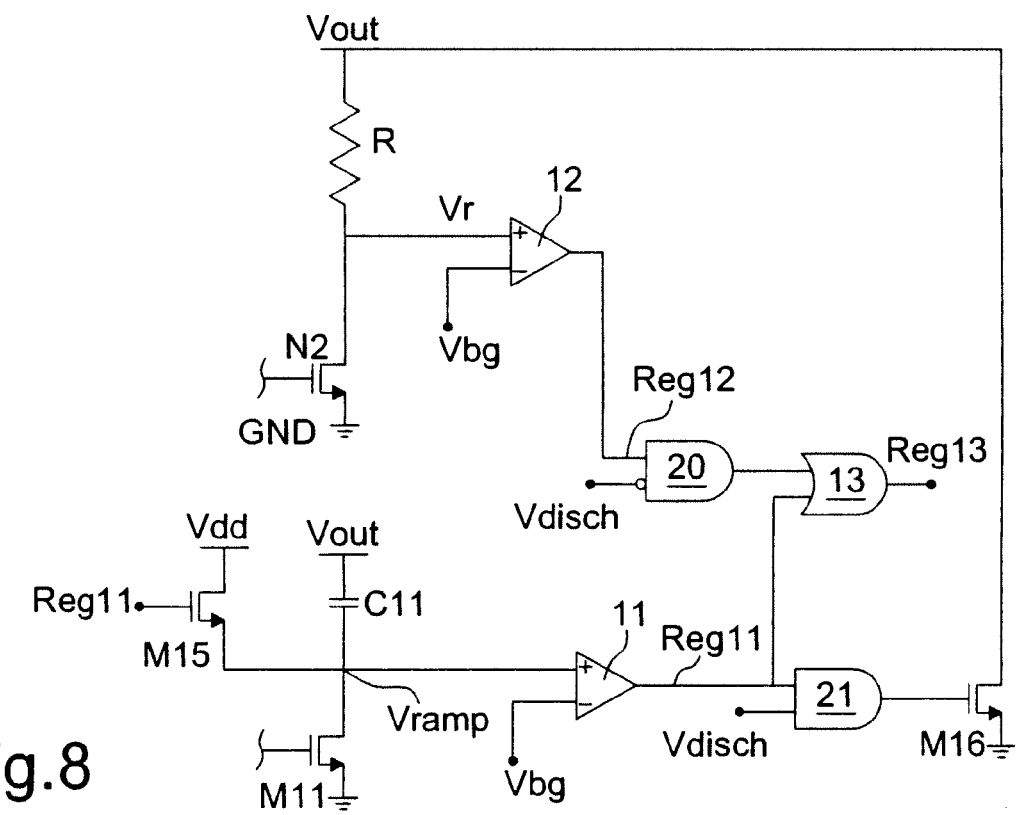
FIG. 8 shows an integrated control circuit of a charge pump according to another version of the embodiment of the present invention.

In FIGS. 7 and 8 there are circuit alternatives comprising the circuit in FIG. 6 with two different circuit arrangements for discharging capacity.

In FIG. 7 the circuit arrangement comprises a PMOS transistor M15 having the source terminal connected to a supply voltage Vdd and the drain terminal connected to the voltage Vramp; by switching on the capacitive branch during the discharge of the capacitor C11 the latter is forced to evolve into a ramp. In fact if the PMOS transistor M15 is controlled by the signal Reg11, the ramp generator modulates through the output of the comparator 11 the descent of the voltage Vout. The transistor M15 has to have dimensions such as to ensure a certain tilt of the descent ramp in conditions of maximum charge. In this way, constant discharge time is ensured as the charge varies.

The circuit in FIG. 8 differs from the circuit in FIG. 7 through the addition of a filter 20-21. The filter comprises a first AND gate 20 having the input signals Reg12 and the negated signal Vdisch, where Vdisch is the discharge voltage of the transistor M15. The output signal from the AND gate 20 is the input signal to the OR gate. An AND gate 21 has the input signals Reg11 and Vdisch and the output pilots a transistor M16 the drain terminal of which is connected to the voltage Vout whilst the source terminal is connected to ground. Said filter is necessary so that the signal Reg11 does not interfere with the information provided by the capacitive branch.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

The invention claimed is:

1. An integrated control circuit for a charge pump, said integrated circuit comprising:
   a first device suitable for regulating the output voltage of the charge pump;
   a second device for increasing the output voltage from the charge pump with a set ramp; and
   means for activating said first device and providing it with a first value of a supply signal in a first period of time and for activating said second device and for providing it with a second value of the supply signal that is greater than the first value in a second period of time after the first period of time,
wherein the output voltage of the charge pump comprises a ramp ascending from a first value to a second value that is greater than the first value, and said second value is fixed by a reactivation of the first device, and wherein said second device comprises a capacitor coupled with the output voltage of the charge pump and with the terminal of a comparator having at the other terminal said reference voltage, said capacitor being charged by the supply signal.

2. The integrated control circuit according to claim 1, wherein said supply signal comprises a current.

3. The integrated control circuit according to claim 1, wherein said first device comprises a resistance coupled with the output voltage of the charge pump and with the terminal of a comparator having at the other terminal a reference voltage, said resistance being traversed by the supply signal.

4. An integrated control circuit for a charge pump, said integrated circuit comprising:
   a first device suitable for regulating the output voltage of the charge pump;
   a second device for increasing the output voltage from the charge pump with a set ramp; and
   means for activating said first device and providing it with a first value of a supply signal in a first period of time and for activating said second device and for providing it with a second value of the supply signal that is greater than the first value in a second period of time after the first of time,
wherein said first period of time comprises a first subperiod wherein the voltage at the inputs of a comparator associated with the first device are made the same and a second subperiod wherein the voltage at the inputs of a comparator associated with the second device are made the same.

5. The integrated circuit according to claim 4, further comprising an OR gate having as inputs the outputs of the comparators associated with the first and the second devices and the output of said OR gate being the input to the charge pump.

6. The integrated circuit according to claim 1, further comprising a ramp discharge circuit for the capacitor of the second device.

7. The integrated circuit according to claim 6, wherein said ramp discharge circuit comprises a transistor coupled with the capacitor.

8. The integrated circuit according to claim 1, further comprising means for filtering the output signal from a comparator associated with the first device to prevent it interfering with the output signal from a comparator associated with the second device.

9. A method for controlling an output voltage from a charge pump comprising setting a first value at said output voltage using a first device and a ramp ascent with a preset ramp using a second device from said first value to a second value greater than the first value, wherein the output voltage of the charge pump comprises a ramp ascending from a first value to a second value fixed by a reactivation of the first device that is great than the first value, and filtering an output signal from a comparator associated with the first device to prevent it interfering with an output signal from a comparator associated with the second device.

10. An integrated control circuit for a charge pump having an output voltage, said integrated circuit comprising:
    a first device for regulating the output voltage of the charge pump;
    a second device for increasing the output voltage from the charge pump with a set ramp;
    means for activating said first device and providing it with a first value of a supply signal in a first period of time and for activating said second device and providing it with a second value of the supply signal that is greater than the first value in a second period of time after the first period of time, wherein the output voltage of the charge pump comprises a ramp ascending from a first value to a second value that is greater than the first value and is fixed by a reactivation of the first device; and
    means for filtering an output signal from a comparator associated with the first device to prevent it interfering with an output signal from a comparator associated with the second device.

11. The integrated control circuit according to claim 10, wherein said supply signal comprises a current.

12. The integrated control circuit according to claim 10, wherein said first device comprises a resistance coupled with the output voltage of the charge pump and with the terminal of a comparator having at the other terminal a reference voltage, said resistance being traversed by the supply signal.

13. The integrated circuit according to claim 10, wherein said second device comprises a capacitor coupled with the output voltage of the charge pump and with the terminal of a comparator having at the other terminal said reference voltage, said capacitor being charged by the supply signal.

14. The integrated circuit according to claim 13, further comprising a ramp discharge circuit for the capacitor of the second device.

15. The integrated circuit according to claim 14, wherein said ramp discharge circuit comprises a transistor coupled with the capacitor.

16. A control circuit for a charge pump comprising:
    first and second current mirrors being coupled to a control circuit;
    a third current mirror having an input coupled to an output of the first current mirror, and an output coupled to a resistor;
    a fourth current mirror having an input coupled to an output of the second current mirror, and an output coupled to a capacitor;
    a first comparator having a first input coupled to the output of the third current mirror, a second input for receiving a reference voltage, and an output;

a second comparator having a first input coupled to the output of the fourth current mirror, a second input for receiving the reference voltage, and an output; and a logic circuit having a first input coupled to the output of the first comparator, a second input coupled to the output of the second comparator, and an output for controlling a charge pump.

17. The control circuit of claim 16, wherein the first and second current mirrors comprise PMOS current mirrors.

18. The control circuit of claim 16, wherein the third and fourth current mirrors comprise NMOS current mirrors.

19. The control circuit of claim 16, wherein the reference voltage comprises a bandgap reference voltage.

20. The control circuit of claim 16, wherein the resistor is coupled between the output of the third current mirror and an output of the charge pump.

21. The control circuit of claim 16, wherein the capacitor is coupled between the output of the fourth current mirror and an output of the charge pump.

22. The control circuit of claim 16, wherein the logic circuit comprises an OR gate.

* * * * *